United States Patent [19]

Iwamatsu

[11] 4,087,759
[45] May 2, 1978

[54] POWER AMPLIFIER DEVICES

[75] Inventor: Masayuki Iwamatsu, Hamamatsu, Japan

[73] Assignee: Nippon Gakki Seizo Kabushiki Kaisha, Japan

[21] Appl. No.: 772,902

[22] Filed: Feb. 28, 1977

[30] Foreign Application Priority Data

Mar. 2, 1976 Japan ............................ 51-23986[U]

[51] Int. Cl.² .............................................. H03F 3/26
[52] U.S. Cl. .................................. 330/262; 330/263; 330/297
[58] Field of Search ...................... 330/13, 15, 22, 40

[56] References Cited

U.S. PATENT DOCUMENTS

| 2,776,382 | 1/1957 | Jensen | 331/113 R |
| 3,426,290 | 2/1969 | Jensen | 330/40 |

FOREIGN PATENT DOCUMENTS 1,918,618  10/1970  Germany ............................ 330/40

*Primary Examiner*—James B. Mullins
*Attorney, Agent, or Firm*—Charles W. Helzer

[57] ABSTRACT

A power amplifier device comprises a power amplifier including an output transistor and voltage is applied to the output transistor from a source through a switching type stabilized source device. The source device produces a reference voltage equal to the sum of the output voltage of the amplifier and a constant voltage required to be impressed across the collector and emitter electrodes of the output transistor.

7 Claims, 7 Drawing Figures

POWER AMPLIFIER DEVICES

BACKGROUND OF THE INVENTION

This invention relates to a power amplifier device, more particularly a transistor power amplifier device.

Various types of transistor power amplifier devices have been proposed. However, in the conventional amplifier devices the collector loss in an output transistor inevitably becomes large in accordance with the output of the amplifier. The large collector loss results in heating the output transistor. As a result, an elaborate cooling means and a high withstand voltage output transistor are required.

These problems will be briefly described with reference to FIG. 1. The prior art power amplifier device shown in FIG. 1 is an OCL (output condencerless) complementary SEPP (complementary single ended push-pull) circuit and comprises an input terminal 11 for receiving an input signal from a preceding stage, such as a low frequency amplifier, not shown, and an amplifier 12 with one input terminal ⊕ connected to the input terminal 11 and to the ground through a resistor 13 and the other input terminal ⊖ connected to the ground through a resistor 14. There are also provided a pair of DC sources 16 and 17 having opposite polarities, and bipolar output transistors 18 and 19, the former being NPN type and the latter PNP type. The transistors 18 and 19 are connected to act complementally with respect to each other and each connected to act as an emitter follower type. The emitter electrodes are commonly connected. The collector electrode of transistor 18 is connected to the positive pole of source 16 via $+V_{c2}$ terminal 24 while the collector electrode of transistor 19 is connected to the negative pole of source 17 via $-V_{c2}$ terminal 26. The base electrodes of these transistors are commonly connected to the output terminal of the amplifier 12, and the commonly connected emitter electrodes are connected to the grounded juncture between sources 16 and 17 via an output terminal 21 and a load resistor 22. Furthermore, the commonly connected emitter electrodes are connected to the negative terminal of amplifier 12 via a feedback resistor 23. The amplifier 12 is connected to the positive pole of source 16 and the negative pole of source 17 respectively through $+V_{c1}$ terminal 23 and $-V_{c1}$ terminal 25.

The amplifier circuit shown in FIG. 1 operates as follows. The input signal applied to the input terminal 11 from the preceding stage is amplified by the amplifier 12 and then power-amplified by output transistor 18 or 19 according to the polarity of the input signal and the amplified output is supplied to the common load resistor 22.

In this power amplifier device, the source 16 or 17 is required to supply voltage equal to the sum of the maximum output voltage appearing at the output terminal 21 and the voltage loss of the transistor 18 or 19. Accordingly, the voltage $V_{CE}$ appearing across the collector and emitter electrodes of transistor 18 or 19 is equal to the difference between the source voltage and the output voltage appearing at the output terminal 21, and a power equal to the product of this voltage $V_{CE}$ and the output current generates a collector loss $P_c$. In the prior art power amplifier device described above the collector-emitter voltage $V_{CE}$ is different between the normal output and the maximum output. This voltage occupies a substantial portion of the source voltage in the presence of an input signal, and under these conditions, when the output current is increased the power loss of the output transistor 18 or 19 becomes substantial. For example, the efficiency of the prior art A class power amplifier is about 40 to 50% and that of the B class power amplifier is about 60 to 70%. From this fact, it can be readily understood that the power loss of the output transistor is large. Accordingly, the power loss (collector loss) and hence heating of the output transistors increases as the output increases. For this reason, the prior art power amplifier device requires to use expensive high power transistors or to provide elaborate cooling means.

Moreover, as the value of the collector-emitter voltage $V_{CE}$ varies greatly with the magnitude of the input signal it is impossible to maintain the linearity between the variation in the base current and $\Delta V_{CE}/\Delta I_c$, where $I_c$ represents the collector current. Furthermore, as the amplitude varies up to the saturation range, it is liable to form a switching distortion.

It is also necessary to increase the breakdown voltage across the collector and emitter electrodes of the output transistors beyond twice or more of the source voltage by taking into consideration the fact that an abnormal transient voltage is impressed across the collector and emitter electrodes at the time of cutting off which is caused by an inductive load. This also requires expensive output transistors.

As above described, in the prior art transistor power amplifier device variation in the collector-emitter voltage $V_{CE}$ of the output transistors causes various problems described above. This is especially true in high output power amplifier devices and A class power amplifier devices.

A pulse amplifier has been developed as a power amplifier having a small collector loss and a high efficiency of the order of 90% but this type of the power amplifier requires a special modulation circuit (PCM or PWM) and a carrier wave filter thereby complicating the construction and increasing the cost. Moreover, the linearity and fidelity of the component parts have a large influence upon the characteristics of the power amplifier.

SUMMARY OF THE INVENTION

Accordingly the principle object of this invention is to provide an improved power amplifier device of simple construction and capable of reducing the collector loss without using any complicated means.

Another object of this invention is to provide an improved power amplifier device capable of using inexpensive output transistors having small breakdown voltage.

Still another object of this invention is to provide a novel power amplifier device having extremely high efficiencies.

A further object of this invention is to provide a power amplifier device which generates less heat so that its heat design is simple.

Still a further object of this invention is to provide an improved power amplifier device which is small size yet can provide a high power amplification whether it may be of A class or B class.

According to this invention, these and further objects can be accomplished by providing a power amplifier device comprising a power amplifier including an output transistor, a source of voltage, and a switching type stabilized source circuit connected between the output transistor and the voltage source, the switching type stabilized source circuit producing a reference voltage equal to the sum of a constant voltage required to be impressed across the collector and emitter electrodes of the output transistor, and the output voltage of the power amplifier.

DESCRIPTION OF THE PREFERRED EMBODIMENTS

Figure 1:
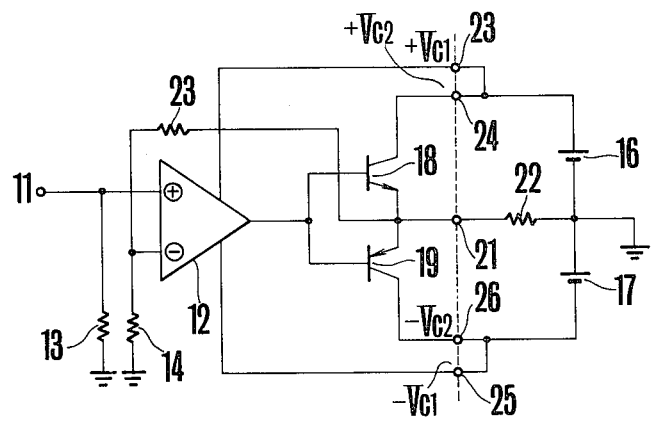
FIG. 1 is a connection diagram showing a typical prior art power amplifier device.
Figure 2:
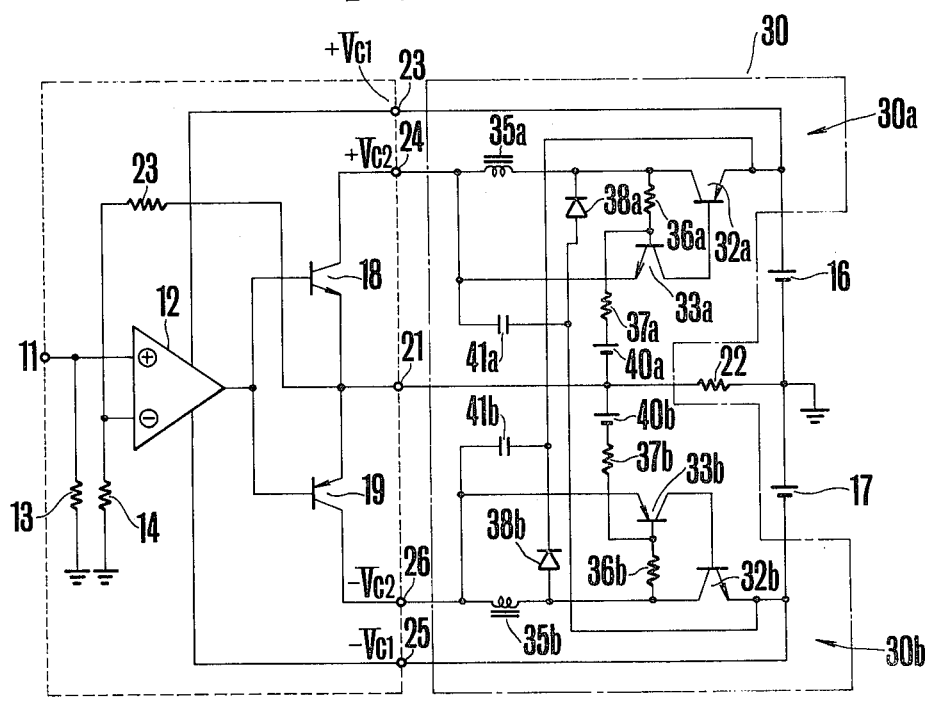
FIG. 2 is a connection diagram showing one embodiment of the novel power amplifier device of this invention.

FIG. 2 shows one example of the power amplifier device embodying the invention in which the portions bounded by dotted lines correspond to the power amplifier device shown in FIG. 1 and corresponding elements are designated by the same reference numerals. Portions bounded by dot and dash lines represent a symmetrical switching requlator device 30 of this invention which comprises two stabilized source circuits 30a and 30b connected in series with the output transistors 18 and 19 of the power amplifier device. These source circuits are constructed to provide a reference voltage equal to the sum of the collector-emitter voltage required for the output transistors and the output voltage of the power amplifier.

The detail of the switching type stabilized source circuit 30a combined with the output transistor 18 adapted to amplify the positive side of the input signal will firstly be described. The collector electrode of a PNP transistor 32a is connected to the collector electrode of the output transistor 18 of the power amplifier device through an inductor 35a and $+V_{c2}$ terminal 24 while the emitter electrode of transistor 32a is connected to the positive pole of source 16. The emitter electrode of transistor 33a is connected to $+V_{c2}$ terminal 24 and the base electrode is connected to the collector electrode of transistor 32a via a resistor 36a and to a voltage source 40a having a constant voltage $E_a$ via a resistor 37a. The other pole of the source 40a is connected to the output terminal 21 of the power amplifier device. The juncture between the collector electrode of transistor 32a and the inductor 35a is connected to the negative pole of source 17 via a reversely poled diode 38a, and the anode electrode of diode 38a is coupled to the juncture between inductor 35a and $+V_{c2}$ terminal 24 through a capacitor 41a.

The stabilized source circuit 30b combined with the output transistor 19 adapted to amplify the negative side of the input signal has a construction symmetical with the stabilized source circuit 30a described above, thus constituting a symmetrical switching regulator 30. More particularly, transistors 32b and 33b correspond to the transistors 32a and 33a respectively of the source circuit 30a. The collector electrode of transistor 32b is connected to the collector electrode of the output transistor 19 via an inductor 35b and a $-V_{c2}$ terminal 26, and the emitter electrode of transistor 32b is connected to the negative pole of a source 17. The base electrode of transisstor 32b is connected to the collector electrode of transistor 33b. The emitter electrode of transistor 33b is connected to the juncture of the inductor 35b and terminal 26 while the base electrode is connected to the collector electrode of transistor 32b through a resistor 36b and to one pole of a source of constant voltage 40b through a resistor 37b. The other pole of the source 40b is connected to the output terminal 21. The juncture between the collector electrode of transistor 32b and the inductor 35b is connected to the positive pole of source 16 via a forwardly poled diode 38b. The cathode electrode of the diode 38b is coupled to the juncture between the reactor 35b and the terminal 26 via a capacitor 41b.

Figure 3:
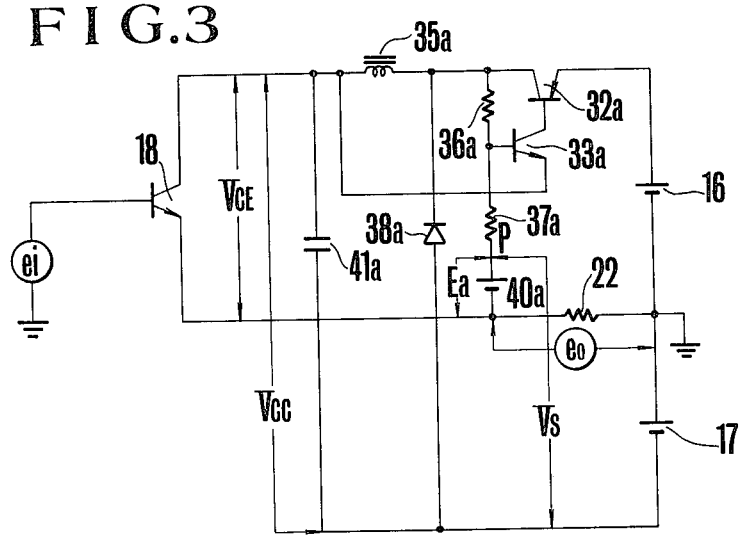
FIG. 3 is a connection diagram showing only a transistor for amplifying the positive side of an input signal and a switching type stabilized source circuit associated with the transistor.

FIG. 3 is a connection diagram showing the output transistor 18 adapted to amplify the positive side of the input signal and the switching type stabilized source circuit 30a combined with transistor 18. This diagram is helpful to understand the operation of the embodiment shown in FIG. 2. In FIG. 3, $ei$ represents a source of input voltage to the output transistor 18 and corresponds to the output of the amplifier 12 shown in FIG. 2. $V_{cc}$ represents the source voltage of the power amplifier device and $e_o$ represents the output voltage.

When the source voltage is applied to the power amplifier device a predetermined bias voltage $E_a$ is applied to the base electrode of transistor 33a from the source of constant voltage 40a thus turning ON transistor 33a. Consequently, current flows through the base electrode of transistor 32a thus turning ON transistor 32a, with the result that the source voltage $V_{cc}$ is applied to the collector electrode of output transistor 18 via the emitter-collector path of transistor 32a and the inductor 35a. Thus applying a bias voltage to the output transistor 18. Under these conditions when a forward component is applied to the output transistor 18 from the voltage source $ei$, the output current of transistor 18 varies in accordance with the input thus varying the output voltage $e_o$. At this time, since the source 40a of the reference voltage $Ea$ is connected across the collector and emitter electrodes of transistor 18 through inductor 35a and resistors 36a and 37a, the voltage $V_{CE}$ across the collector and emitter electrodes of transistor 18 will be fixed to the voltage $Ea$ of the source of reference voltage 40a regardless of the magnitude of the input signal. Thus, when the collector-emitter voltage $V_{CE}$ of transistor 18 tends to increase beyond the source voltage $Ea$, the emitter voltage of transistor 33a becomes higher than the base voltage thus turning OFF this transistor 33a. As a result, transistor 32a is turned OFF. On the contrary, when the collector-emitter voltage $V_{CE}$ of transistor 18 becomes lower than the terminal voltage $Ea$ of the source of constant voltage 40a, the base potential of transistor 33a becomes higher than the emitter voltage thus turning ON transistors 33a and 32a. The operation described above is repeated thus maintaining the voltage $V_{CE}$ of the output transistor 18 at a substantially constant value. In FIG. 3 diode 38a conducts when transistor 32a turns OFF thus passing current through inductor 35a. The purpose of the inductor 35a and capacitor 41a is to smooth out the current.

Considering the above described operation in more detail, it is now supposed that the voltage between the negative pole of source 17 and the juncture P between the source of constant voltage 40a and the resistor 37a is used as a reference voltage Vs, then the reference voltage is expressed by an equation $$Vs = Ea + Vb + e_o \qquad (1)$$

where Ea represents the terminal voltage of the source of reference voltage 40a and it is selected to a value not to cause the output transistor 18 to saturate, for example 2 to 3 volts, and Vb represents the terminal voltage of source 17.

When the internal impedances of the sources 40a and 17 are sufficiently low, and when their terminal voltages are constant the collector-emitter voltage $V_{CE}$ of the output transistor 18 is expressed by $$V_{CE} = V_{cc} - (e_o + Vb) \qquad (2)$$

The source voltage $V_{cc}$ as seen from the output side of transistor 18 is $$V_{cc} = Vs \cdot A \qquad (3)$$

where A is the DC gain of the switching type stabilized source circuit 30a.

From equations (1), (2) and (3)

$$V_{CE} = Vs \cdot A - (e_o + Vb) = (Ea + Vb + e_o) \cdot A - (e_o + Vb) \qquad (4)$$

Putting A=1 in equation (4), the collector-emitter voltage $V_{CE}$ of the output transistor 18 becomes $$V_{CE} = Ea.$$

Figure 4:
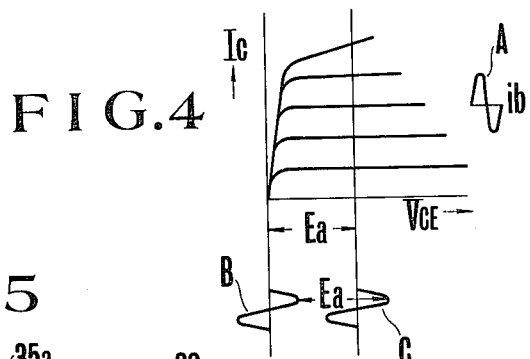
FIG. 4 is a graph useful to explain the operation of the circuit shown in FIG 3.

This means that the collector-emitter voltage $V_{CE}$ is constant regardless of the magnitude of the input signal as shown in FIG. 4 wherein the abscissa represents the collector-emitter voltage $V_{CE}$ and the ordinate the collector current Ic. In FIG. 4 a waveform A shows the input signal and ib the base current. Curve B shows the output wave appearing at the output terminal 21 (FIG. 2) and curve C the collector voltage of the output transistor 18.

In this manner, when the collector-emitter voltage $V_{CE}$ is fixed to a small value Ea it is possible to decrease the collector loss Pc of the output transistor of the power amplifier device and to decrease the breakdown voltage required for the output transistor.

Figure 5:
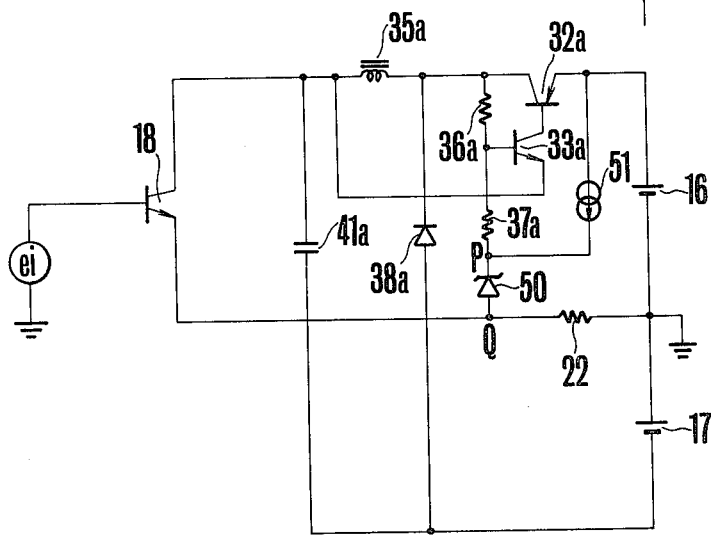
FIGS. 5 to 7 are connection diagrams showing various examples of standardized switching type stabilized source circuits.
Figure 6:
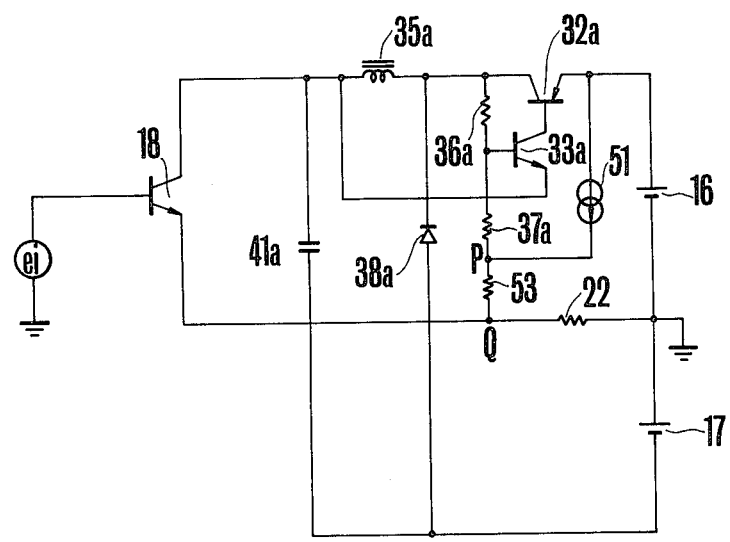
Figure 7:
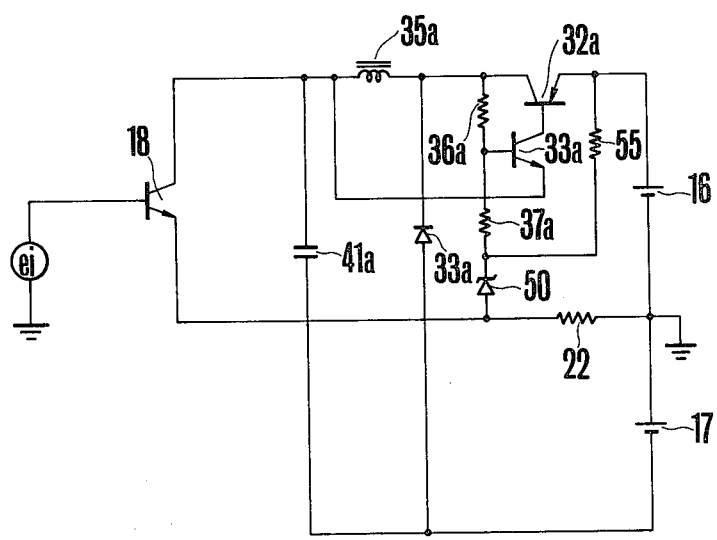

FIGS. 5, 6 and 7 show modified examples of the source of constant voltage 40a shown in FIG. 3. In FIG. 5, the source of constant voltage 40a is constituted by a Zener diode 50 and a source of constant current 51. The Zener diode 50 is connected between resistors 37a and 22, and across the juncture P between the Zener diode and resistor 37a and the positive pole of source 16 is connected the source of constant current 51. Consequently, the voltage between point P and the juncture Q between the Zener diode 50 and the resistor 22 is fixed to the Zener voltage $V_{ZD}$.

In the case shown in FIG. 6, the source of constant voltage 40a is similar to that shown in FIG. 5 except that the Zener diode 50 is replaced by a resistor 53. With this modification too, the voltage between points P and Q can be maintained substantially constant.

In the case shown in FIG. 7, the source of constant voltage 40a is similar to that shown in FIG. 5 except that resistor 55 is substituted for the constant current source 51. It should be understood that many other types of the source of reference voltage can be used such as an ordinary constant voltage source.

As above described, according to this invention it is possible to reduce the collector loss of an output transistor of a power amplifier by a simple circuit construction. Moreover, as it is possible to reduce the breakdown voltage of the output transistor, it is possible to use small and inexpensive transistors, thus increasing the degree of freedom of design. The power amplifier of this invention has an efficiency of about 90% which is comparable with that of a pulse amplifier. Moreover, as the heat generation is reduced by low emitter collector voltage and switching type stabilized source circuit is easier. Accordingly, it is possible to obtain a compact and large capacity amplifier device whether it operates as an A class or a B class amplifier. Especially where a large output is desired, according to the prior art amplifier it is inevitable to use a transistor producing a large collector loss but according to this invention, it is possible to use a transistor producing a small collector loss.

It should be understood that the invention is not limited to the specific embodiments described above and that many changes and modifications will be obvious to one skilled in the art. For example, the invention is not limited to a power amplifier utilizing an output condenserless complementary single ended push-pull circuit but an A class amplifier utilizing a single transistor or any other type of the power amplifier can also be used.

Further instead of using a resistive load, an inductive load or a combination of a resistive load and an inductive load can also be used.

What is claimed is:

1. A power amplifier including an output transistor, a source of excitation voltage for the power amplifier, a switching type regulating circuit connected between said output transistor and said excitation voltage source for regulating application of said excitation voltage to said output transistor, a load element for said power amplifier having one end connected to the emitter electrode of said output transistor through an output terminal and the other end grounded, and said switching type regulating circuit being responsive to a regulating voltage equal to the sum of a constant voltage required to be impressed across the collector and emitter electrodes of said output transistor and the output voltage of said amplifier derived across the load element whereby the collector-emitter voltage of the output transistor is maintained at a substantially constant value irrespective of the output terminal voltage.

2. The power amplifier according to claim 1 wherein said switching type regulating circuit includes a source of reference voltage which is utilized to form said constant voltage required to be impressed across the collector and emitter electrodes of said transistor.

3. The power amplifier according to claim 2 wherein said source of reference voltage comprises a Zener diode and a source of constant current.

4. The power amplifier according to claim 2 wherein said source of reference voltage comprises a source of constant current and a resistor.

5. The power amplifier according to claim 2 wherein said source of reference voltage comprises a Zener diode and means for applying a predetermined bias voltage across said Zener diode.

6. A power amplifier comprising a source of direct current, an output transistor, a load element for said power amplifier, one end of said load element being connected to the emitter electrode of the output transistor through an output terminal and the other end grounded, a switching type regulating circuit connected between said output transistor and said direct current source, said regulating circuit comprising a first switching means connected in a circuit between said direct current source and said output transistor, a source of reference voltage producing a constant voltage, and a second switching means for opening said first switching means upon the collector-emitter voltage of said output transistor becoming higher than the voltage of said source of reference voltage, whereby the collector-emitter voltage of the output transistor is maintained at a substantially constant voltage irrespective of the output terminal voltage.

7. A power amplifier comprising first and second DC sources, a single load device, at least first and second output transistors for constituting together with said first and second DC sources and said load device, a single ended push-pull power amplifier circuit that does not require the use of output capacitors or transformers, first and second switching type regulating circuits connected between said first and second output transistors and said first and second DC sources, respectively, each of said switching type regulating circuits including a first switching means interposed between the DC source and output transistor, a reference voltage source producing a constant voltage, a second switching means which opens said first switching means upon the collector-emitter voltage of one of the output transistors becoming higher than the voltage of said reference voltage source, one end of said load device being connected to the emitter electrodes of said output transistors through a common output terminal and the remaining end being grounded and means for applying the voltage across said load device and said reference voltage source to said second switching means as a regulating voltage whereby the collector-emitter voltages of the output transistors are maintained at a substantially constant voltage irrespective of the output terminal voltage.

* * * * *